United States Patent [19]

Larson

[11] Patent Number: 4,471,837

[45] Date of Patent: Sep. 18, 1984

[54] GRAPHITE HEAT-SINK MOUNTINGS

[75] Inventor: Ralph I. Larson, North Reading, Mass.

[73] Assignee: Aavid Engineering, Inc., Laconia, N.H.

[21] Appl. No.: 335,156

[22] Filed: Dec. 28, 1981

[51] Int. Cl.³ .......................................... H01L 23/42
[52] U.S. Cl. .................................. 165/185; 428/408
[58] Field of Search ............. 166/DIG. 8, 185, 80 A, 166/80 B, 80 C, 80 D, 80 E, DIG. 10, DIG. 4; 428/408, 913; 361/386, 387, 388, 389; 174/16 HS

[56] References Cited

U.S. PATENT DOCUMENTS

| | | | |
|---|---|---|---|
| 2,917,404 | 12/1959 | Melzer et al. | 165/DIG. 8 |
| 2,964,688 | 12/1960 | McAdam | 174/16 HS |
| 3,187,226 | 6/1965 | Kates | 165/80 B |
| 3,391,242 | 7/1968 | Sudges | 174/16 HS |
| 3,404,061 | 10/1968 | Shane et al. | 428/408 X |
| 4,233,645 | 11/1980 | Balderes et al. | 361/386 X |
| 4,355,684 | 10/1982 | Caines | 165/DIG. 8 |

FOREIGN PATENT DOCUMENTS

| | | | |
|---|---|---|---|
| 600823 | 6/1960 | Canada | 165/DIG. 4 |
| 1153115 | 3/1958 | France | 165/185 |

OTHER PUBLICATIONS

Maximum Heat Transfer Medium, Berndlmaier et al., IBM Tech. Disc. Bull., vol. 20, No. 11A, Apr. 1978, pp. 4389-4390.

*Primary Examiner*—Sheldon J. Richter
*Attorney, Agent, or Firm*—James E. Mrose

[57] ABSTRACT

Efficient dissipation and uniform spreading of heat from electronic solid-state devices by their associated heat-sink structures is promoted by thin broad-area thermally-conductive mountings built up from layers of a special form of substantially pure flexible and compressible flat graphite sheet material and a bonding-and-filling coating. At least one such 5-10 mil thickness layer of Grafoil flexible sheet, involving a crushable compressed mass of expanded graphite particles which are plate-like and oriented essentially parallel with the sheet surfaces, is intimately connected with a very thin bonding-and-filling coating substantially fully along its broad-area surfaces, and the latter coating is bonded at elevated temperature and pressure into a self-adhering relationship with surfaces of a heat-sink device intended to be disposed opposite surfaces of an electronic semiconductor device from which excess heat is to escape. The coating is applied while in a liquid condition, in quantity sufficient to be effective to fill minute interstitial spaces appearing along the heat-sink surfaces and yet not so thickly as to prevent numerous point contacts from being made at sites of minute surface irregularities of the graphite sheet material and the heat-sink device. Mechanical fastening of a semiconductor device atop the prepared mounting layers of the heat-sink device compresses the crushable graphite sheet material so that voids are minimized and low thermal impedance can be realized between the heat sink and semiconductor device.

14 Claims, 4 Drawing Figures

GRAPHITE HEAT-SINK MOUNTINGS

BACKGROUND OF THE INVENTION

The present invention relates to improvements in the mounting of electronic devices and the like in relation to their associated heat sinks, and, in one particular aspect, to novel and improved thin readily-applied mounting pad arrangements of low-cost composite construction which establish high-quality thermal transfer characteristics between semiconductor devices and heat sinks largely by way of crushable expanded-graphite particle material.

As is well known, at the current stage of developments in the art, applications of miniature semiconductor devices and microcircuit modules are severely limited in respect of the self-generated heat which they can successfully expel and prevent from building up as they are caused to operate at higher and higher powers. In some instances, the environments of use permit complex forced-fluid cooling systems to be employed, but a very common and economical expedient instead involves the attachment of simpler finned metal extrusions or stampings which help to conduct and radiate heat away from the thermally-vulnerable regions. For such purposes, it is important that the thermal impedance between a semiconductor or microcircuit unit and its associated heat sink structure be kept to a minimum and that it be of uniformity which will prevent build-up of localized hot spots. Those characteristics are not always realized to a satisfactory extent by simply abutting some part of the heat-generating unit with complementary surfaces of its heat sink, because, despite appearances, the respective mating surfaces will generally exhibit only a very surprisingly small percentage of area in actual sound contact. In part, such contact failure, and attendant poor transmission of heat, tends to be caused by relatively gross surface imperfections, whose effects might be offset somewhat by subjecting the complementary surfaces to precise machining or other shaping. And, in part, such contact failures can be attributed to microscopic surface irregularities, which will remain at the interfaces even if the cooperating parts are formed and finished with great care. When it becomes necessary to insulate one part from the other, electrically, the heat-conduction problems are greatly compounded.

Among the prior practices which have been employed in efforts to improve the heat flow from semiconductor or like devices to their heat sinks is that of spreading amorphous oil or grease, such as silicone, between the joined surfaces. The messy character of such a filler, as well as the uses of insulating mica and varnish insulating layers, are referred to in U.S. Pat. No. 3,229,757. Thermal grease and/or powdered metal, contained by a film, has likewise been proposed to augment heat transfer, in U.S. Pat. No. 4,092,697, although the fabrication and handling of such small "pillows" obviously involves special problems also. Cooling fins have been secured by way of epoxy cement loaded with powdered metal (U.S. Pat. No. 3,261,396), and large-area epoxy films have been said to insulate while yet transferring large quantities of heat (U.S. Pat. No. 3,611,046). In U.S. Pat. No. Re. 25,184, electrically non-conductive plastic coating material is filled with molybdenum disulphide to promote heat conduction, and, where electrical insulation is not essential, a dimpled malleable metal wafer has been interposed to increase transfer of heat (U.S. Pat. No. 4,151,547).

SUMMARY OF THE INVENTION

The present invention is aimed at improving convenience and effectiveness of the mountings of electronic devices in relation to heat sinks, and, in particular, at effecting economies and efficiency in the manufacture and assembly of such combinations and enabling them to form exceptionally sound low-conductivity thermal couplings. In one preferred embodiment, selected surfaces of a metal heat sink, opposite which are to be disposed the complementary surfaces of an electronic semiconductor device from which heat is to be withdrawn, are overlaid by a thin sheet of crushable expanded-graphite material, and the minute interstitial spaces along the interfacing between that material and the heat sink are filled by an exceedingly thin coating bonded to both the sheet and heat sink. A coating material such as paraffin adheres well to the graphite sheet and metal heat sink and holds the sheet in place mechanically, as well as serving to improve heat-transfer characteristics. A like coating on the opposite side of the sheet merges with the complementary surfaces of the semiconductor device when it is bolted or otherwise firmly clamped in place. In instances when the heat sink and semiconductor device should be electrically insulated, a thin insulating plastic film is sandwiched between two such expanded-graphite sheets, bonded in place between like exceedingly-thin coatings of the bonding-and-filling material.

Accordingly, it is one of the objects of this invention to provide novel and improved thermal-pad mountings for promoting highly effective transfer of heat from electronic semiconductor devices to heat sinks, the pads comprising readily-handled crushable sheets consisting essentially of expanded graphite particles.

A further object is to provide unique and advantageous thermal-matching mountings involving crushable expanded graphite particles in thin sheet form affixed to surfaces of heat sinks and semiconductor devices by way of yet thinner coatings of material which both fill interstitial spaces as an aid to thermal conduction and bond the sheet into place as an aid to installation of the heat sinks, both the crushable sheet and coating being deformable and conforming under influence of temperature and pressure.

BRIEF DESCRIPTION OF THE DRAWINGS

Although the aspects of this invention which are considered to be novel are expressed in the appended claims, further details as to preferred practices and as to further objects and features thereof may be most readily comprehended through reference to the following detailed description when taken in connection with the accompanying drawings, wherein:

DETAILED DESCRIPTION OF THE PREFERRED EMBODIMENTS

Figure 1:
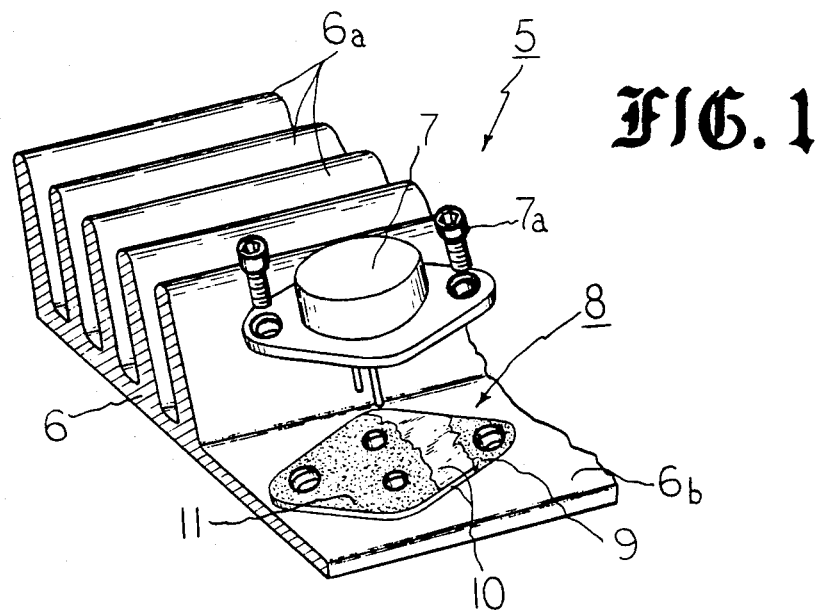
FIG. 1 is a pictorial view of a portion of a heat sink together with a broken-away illustration of an improved pad-type mounting for an electronic semiconductor device, the latter and its fasteners being separated from the heat sink in an "exploded" relationship to expose the mounting arrangement.

Having reference to the drawings, wherein like reference characters designate identical or corresponding parts throughout the different views, and more particularly to FIG. 1 thereof, one embodiment of an improved heat-sinking combination, 5, is shown to involve an extruded metal heat sink 6 having multiple ribs or fins 6a and a planar base portion 7b to which an electronic semiconductor package 7 is to be affixed by way of fasteners such as the bolt 7a. Package 7 will be recognized as a commonly-known type TO-3 power transistor, but, like heat sink 6, is illustrative only, other semiconductor devices and circuit modules and heat sink configurations also being served to advantage by improved mounting arrangements which exploit key features of the thin crushable mounting pad 8. The latter pad has the general outline of the semiconductor package with which it is intended to cooperate, in this case the base outline of a TO-3 package, and is self-adhered to the substantially flat upper surfacing of heat-sink base portion 6b by way of an exceedingly thin bottom layer 9. That layer is of the order of about 1/10,000 inch thick, and it adheres both to the aforesaid upper heat-sink surfacing and to the lower surfaces of a much thicker major layer 10 which is uniquely a flexible expanded graphite product. Material of which the major layer 10 is made is highly important because it deforms in beneficial respects under pressures attending the tight fastening of package 7 to heat sink 6, and it exhibits advantageous thermal conductivity, some in preferential directions; at the same time, the layer withstands extremes of temperature while preserving its flexibility, and it is desirably chemically inert and has mechanical integrity allowing it to be handled easily during its installation and to resist crumbling or fracture when tight fastening takes place. Those characteristics are realized with a sheet material which consists essentially of graphite and, in particular, flexible sheeting made from graphite particles which have first been expanded and then compacted together. Such materials are described in U.S. Pat. No. 3,404,061, for example, and are available commercially from Union Carbide Corporation under its registered trademark GRAFOIL. A thickness of the order of about five to ten thousandths of an inch is appropriate for the layer 10, although up to about thirty thousands would be a suitable thickness for such layers when used for the mounting of much larger devices. Atop the expanded graphite sheet there is disposed another very thin coating, 11, preferably of the same filling-and-bonding type material of which layer 9 is composed. In the latter connection, both layers or coatings 9 and 11 are intentionally kept exceedingly thin so that excess amounts of their material will not be present in the finished compressed assembly to impede the flow of heat from device 7 to heat sink 6, but they contain enough material, in a flowable rather than hard state, to substantially fill the numerous tiny voids or interstices which would otherwise be present between the abutted surfaces of the seemingly-smooth expanded-graphite sheet and of the heat sink and semiconductor device. Surface irregularities, even of carefully-finished parts, can be quite coarse on a microscopic scale, and junctures which are intended to be of broad area for optimum heat-transmission purposes may therefore turn out to involve only a very small total of the areas of actual direct point-like contacts, the balance being air-filled voids which conduct heat rather poorly. However, the thermal couplings at such junctions are significantly improved when the minute voids are filled with solidified material, even though it may not be the optimum material for heat-conducting purposes; heat-transfer characteristics tend to be enhanced so long as the thicknesses of such void-filling material are not large. It is for the latter reason that coatings 9 and 11 are only about a ten-thousandth inch thick.

In addition to the thermal "impedance-matching" which they bring about, the two coatings 9 and 11 should of course adhere well to the expanded-graphite layer 10, which has rather high-lubricity surfaces; moreover, lower coating 9 should bond easily with the heat sink, and upper coating 11 preferably should not remain so tacky as to require a protective covering before the device 7 is fastened to the prepared sub-assembly of heat sink 6 and mounting 8. Such coatings also preferably lend themselves to being applied as thin liquids, which will assume more solid form with change in temperature or evaporation of solvents. Ordinary paraffin fills such requirements, for example, and may be thinly coated upon graphite layer 10 while hot and then allowed to solidify; for purposes of pre-mounting with the heat sink 10 to form a sub-assembly combination of heat sink and mounting pad which the user can process conveniently, paraffin may be applied to the receiving surfaces of the heat sink and/or to the bottom of layer 10 and a desired bonding and filling will take place when heat and pressure are applied. In another practice, so-called FEP Teflon in aqueous solution, may be similarly applied and then baked, such that the Teflon will soften and bond after the manner of a glue. Polyethylene, and zinc-filled high-conductivity pastes, may also be used for such coatings. Currently, a preferred coating material for bottom layer 9 is one commercially identified as Loctite No. 324 Structural Adhesive (Loctite Corporation) a thick material requiring dilution with about thirty to forty times its own weight of solvent (trichlorethylene). After dilution, the substance is painted on to the heat sink and the solvent is allowed to evaporate, leaving a thin tacky layer; separately, an activator (copper salt) substance (Loctite No. 724) is sprayed onto the lower surfaces of graphite layer 10 and, when the two layers are brought together under pressure, it triggers a "curing" which establishes a desired bonding. Epoxy resin and hardener materials will provide a similar cured-in-place bonding.

Figure 2:
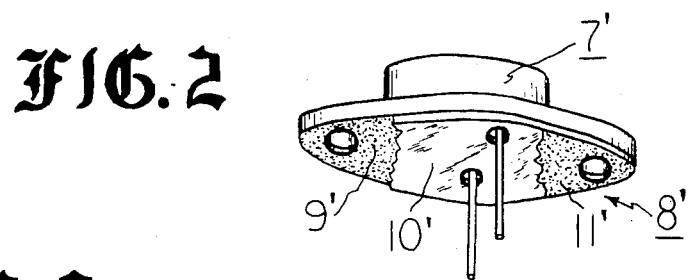
FIG. 2 portrays a type TO-3 power transistor unit having its lower surfaces in heat-transfer relation to the improved mounting arrangement.
Figure 3:
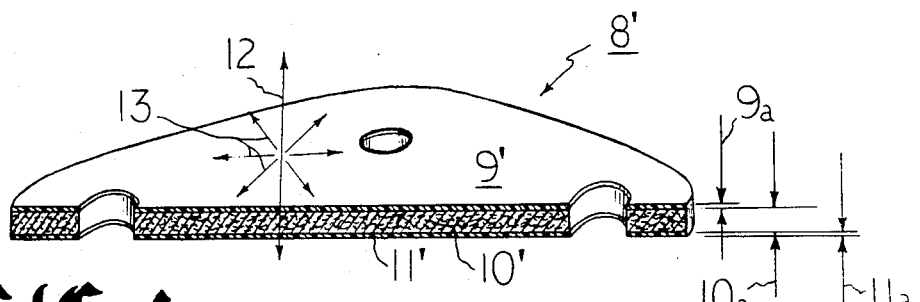
FIG. 3 is a longitudinal cross-section of a mounting-pad arrangement such as that of FIGS. 1 and 2, on an enlarged scale and with dimensional references.

As is represented in FIG. 2, a semiconductor device or the like, 7', may be separately assembled with a mounting pad 8' of the type which has been described. There, the under surface of device 7' is adhered to the ultra-thin coating 11' on the expanded-graphite sheet 10, and the lower surface 9' may be coated, or not, as the application may dictate. Where electrical insulation is required between the device and its heat sink, the heat sink surfaces against which the pad 8' is to be abutted may be anodized, if the nature of its material admits of that. In FIG. 3, the same mounting pad, 8', is illustrated on an enlarged scale, the thicknesses 9a and 11a of coatings 9' and 11' being much less than that, 10a, of the expanded-graphite sheet 10. Such a composite mounting is somewhat flexible, but has structural integrity allowing it to be made and handled and installed as a separate unit. In those instances when the coatings 9' and 11' remain tacky prior to installation, or when they might otherwise become contaminated or injured, they may be temporarily covered by peelable protective plastic films or packets (not shown). The pliable and flexible expanded-graphite layer 10' may be of material prepared as described in the aforesaid U.S. Pat. No. 3,404,061, and can be expected to have anisotropy both physically and in respect of directions in which heat will be conducted more freely. It is preferred that no extraneous binder residues be present in the expanded-graphite layer, and that can be achieved without resins or the like by suitably compressing and rolling the vermiform-particle masses of expanded graphite from which the layer is to be made. In its transverse directions, 12, which are also transverse to the lateral directions 13 in which the expanded-and-compressed vermiform graphite particles extend, the heat conduction tends to be less preferred; however, those transverse directions are the ones in which the aforementioned point-like contacts are made between the layer 10' and the nearby abutted surfaces of a heat sink and electronic device, and the preferential heat conduction in the lateral directions 13 tends to spread and even out the withdrawal of heat.

Figure 4:
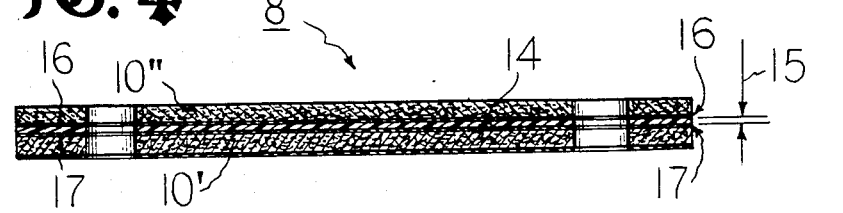
FIG. 4 is a transverse cross-section of an alternative mounting-pad arrangement incorporating an electrical insulation film.

Although anodizing may in some instances interpose a needed electrical insulation, as has been mentioned, it may in some cases be advantageous that a separate insulating layer be incorporated into the mounting. FIG. 4 shows one such unit, 8", in which there are two layers of the expanded-graphite material, 10' and 10", and an intermediate electrical-insulation film or layer 14, such as one of paper or a high-temperature plastic (example: Kapton, a DuPont polyimide material). It is important that the thickness 15 of that insulation layer be kept very small, to minimize its tendencies to increase thermal impedance of the unit; for like reasons, interfaces between that layer and the graphite layers between which it is sandwiched should be made as thermally efficient as possible, and that end is served by exceedingly thin coatings 16 and 17, which are like coatings 9 and 11 (FIG. 1) in that they bond the insulation intimately with the expanded-graphite layers 10' and 10" and fill the otherwise-troublesome voids appearing at the interface interstices. One or both of the exposed graphite layers may also be similarly coated, as at 11', to realize the benefits already described.

Grafoil material, of Union Carbide Corporation, functions well as the substantially-pure expanded-graphite material, although other graphite materials as referred to in said U.S. Pat. No. 3,404,061 may be expected to yield useful results. The material may also be loaded with metal or other highly conductive particles or filaments, to augment the intended effects.

It should therefore be understood that the specific embodiments and practices shown and described herein have been presented by way of disclosure, rather than limitation, and that various modifications, combinations and substitutions may be effected by those skilled in the art without departure in spirit or scope from this invention in its broader aspects and as set forth in the appended claims.

What I claim as new and desire to secure by Letters Patent of the United States is:

1. A mounting for effecting transfer of heat between an electronic device and a heat sink, comprising a substantially flat and thin layer consisting essentially of expanded graphite, and a relatively much thinner coating of bonding-and-filling material adhering to said layer and having qualities allowing it to fill interstitial spaces between abutted surfaces of said layer and a heat sink and to bond said layer to the heat sink.

2. A mounting as set forth in claim 1 wherein said layer is a dense flexible and pliable material in which elongated expanded-graphite particles are partially compressed to a layer thickness of up to about thirty thousandths of an inch, and wherein said coating is of the order of about one ten-thousandth of an inch thick.

3. A mounting as set forth in claim 2 wherein said layer thickness is about five to ten thousandths of an inch, and wherein the material of said coating is bondable with surfaces of the heat sink.

4. A mounting as set forth in claim 3 wherein said material of said coating is meltable at relatively low temperature so as to flow onto and then solidify and bond with surfaces of the heat sink against which it is abutted.

5. A mounting as set forth in claim 4 wherein said material is paraffin solidified after application as said coating in a liquified state.

6. A mounting as set forth in claim 3 wherein said material of said coating is a plastic curable after being applied to said layer and being abutted with the surfaces of the heat sink.

7. A mounting as set forth in claim 3 wherein said material of said coating is an adhesive which is self-bonding with the surfaces of said heat sink under pressure.

8. A mounting as set forth in claim 3 further comprising a thin film of electrically-insulating material overlying said layer and bonded therewith by a second thin coating of bonding-and-filling material adhering both to said layer and to said film and filling interstitial spaces between abutted surfaces thereof.

9. A mounting as set forth in claim 8 further comprising a second flat and thin layer consisting essentially of expanded graphite, overlying said film, and a third thin coating of bonding-and-filling material adhering to both said second layer and to said film and filling interstitial spaces between abutted surfaces thereof.

10. A heat sink and mounting assembly for an electronic device, comprising a heat sink having surfaces disposed to confront and communicate heat from complementary surfaces of an electronic device, a thin layer consisting essentially of expanded graphite overlying said heat sink surfaces, and a relatively much thinner coating of bonding-and-filling material adhering to both said heat sink surfaces and to said layer and substantially filling interstitial spaces therebetween.

11. A heat sink and mounting assembly as set forth in claim 10 wherein said layer comprises elongated expanded-graphite particles compressed from a much larger thickness to up to about thirty thousandths of an inch, and wherein said coating is of the order of about one ten-thousandth of an inch.

12. A heat sink and mounting assembly as set forth in claim 11 wherein said layer is about five to ten thousandths of an inch, and wherein said coating also overlies said layer.

13. A heat sink and mounting assembly as set forth in claim 11 wherein said material of said coating is cured after being applied to said layer and to said surfaces of said heat sink.

14. A heat sink and mounting assembly as set forth in claim 13 wherein said heat sink surfaces carry an activator material for curing said coating material.

* * * * *